United States Patent
Zhang et al.

(10) Patent No.: US 8,043,101 B2
(45) Date of Patent: Oct. 25, 2011

(54) ELECTRONIC DEVICE WITH USB CONNECTOR

(75) Inventors: Bin Zhang, Shenzhen (CN); Yanzhu Huang, Shenzhen (CN); Jie Li, Shenzhen (CN); You Lin, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 0 days.

(21) Appl. No.: 12/686,513

(22) Filed: Jan. 13, 2010

(65) Prior Publication Data

US 2010/0248510 A1   Sep. 30, 2010

(30) Foreign Application Priority Data

Mar. 31, 2009   (CN) ...................... 2009 2 0009451 U

(51) Int. Cl.
*H01R 13/44* (2006.01)
(52) U.S. Cl. ...................................................... 439/133
(58) Field of Classification Search .................... 439/133
See application file for complete search history.

(56) References Cited

U.S. PATENT DOCUMENTS

| | | | |
|---|---|---|---|
| 6,579,108 B1 * | 6/2003 | Goff | 439/131 |
| 6,808,400 B2 * | 10/2004 | Tu | 439/131 |
| 7,104,814 B1 | 9/2006 | She et al. | |
| 7,307,849 B2 * | 12/2007 | Ho et al. | 361/737 |
| 7,632,113 B2 * | 12/2009 | Finn | 439/131 |
| 7,850,468 B2 * | 12/2010 | Ni et al. | 439/131 |
| 2004/0077216 A1 | 4/2004 | Tu | |
| 2004/0090751 A1 | 5/2004 | Choi et al. | |
| 2006/0205252 A1 * | 9/2006 | She et al. | 439/131 |
| 2006/0258196 A1 | 11/2006 | Chen et al. | |
| 2007/0015407 A1 * | 1/2007 | Loftus | 439/607 |
| 2008/0076280 A1 | 3/2008 | Chi et al. | |
| 2009/0177835 A1 * | 7/2009 | Ma et al. | 711/103 |
| 2009/0275224 A1 * | 11/2009 | Ni et al. | 439/131 |
| 2010/0248510 A1 * | 9/2010 | Zhang et al. | 439/131 |

FOREIGN PATENT DOCUMENTS

CN        2735508 Y        10/2005
(Continued)

OTHER PUBLICATIONS

Extended European Search Report in corresponding European Application No. 10151140.0 (Apr. 22, 2010).

*Primary Examiner* — James Harvey
(74) *Attorney, Agent, or Firm* — Leydig, Voit & Mayer, Ltd.

(57) ABSTRACT

An electronic device with a USB connector is provided, which is designed for solving a problem in the conventional art that a USB cap on an electronic device may easily get lost. The electronic device with the USB connector includes an outer housing, an intermediate housing located inside the outer housing and moveable relative to the outer housing, and a circuit board located inside the intermediate housing. The USB connector is disposed on the intermediate housing, and electrically connected to the circuit board. A USB connector through hole is configured on the outer housing at a position corresponding to the USB connector. The electronic device further includes an elastic apparatus disposed in a moving direction of the intermediate housing, and an intermediate housing movement positioning apparatus. The technology is applicable to electronic devices with a USB connector such as a wireless USB Modem or a USB flash drive.

11 Claims, 7 Drawing Sheets

FOREIGN PATENT DOCUMENTS

| | | | |
|---|---|---|---|
| CN | 2930209 | Y | 8/2007 |
| CN | 101295825 | A | 10/2008 |
| CN | 201197231 | Y | 2/2009 |
| CN | 201397897 | Y | 2/2010 |
| EP | 1557907 | A2 | 7/2005 |
| EP | 1703782 | A1 | 9/2006 |
| WO | 2010111950 | A1 | 10/2010 |

* cited by examiner

ELECTRONIC DEVICE WITH USB CONNECTOR

CROSS-REFERENCE TO RELATED APPLICATIONS

This application claims priority to Chinese Patent Application No. 200920009451.6, filed Mar. 31, 2009, which is hereby incorporated by reference in its entirety.

FIELD OF THE TECHNOLOGY

The present invention relates to an electronic device, and more particularly to an electronic device with a USB connector.

BACKGROUND OF THE INVENTION

Recently, a wireless USB Modem in the market usually has the following structure.

As shown in FIG. 1, the USB Modem includes a housing 1, a USB connector 2 fixed on the housing 1, and a USB cap 3 fitted on the USB connector 2. The USB connector 2 is used for connecting to a computer, and the USB cap 3 is used for protecting the USB connector 2.

The inventor found that the conventional art has at least the following problems. The conventional art employs a plug-and-pull USB cap to protect a fixed USB connector of a USB Modem. When intending to realize network connections with the wireless USB Modem, the user needs to pull the USB cap from the USB connector. In this case, the USB cap is separated from the housing of the USB Modem, and thus may easily get lost.

SUMMARY OF THE INVENTION

The present invention is directed to an electronic device with a USB connector, which is capable of solving the problem in the conventional art that the USB cap on the electronic device may easily get lost.

In order to achieve the above objective, the present invention provides the following technical solution.

An electronic device with a USB connector includes an outer housing, an intermediate housing located inside the outer housing and moveable relative to the outer housing, and a circuit board located inside the intermediate housing.

The USB connector is disposed on the intermediate housing, and electrically connected to the circuit board.

A USB connector through hole is configured on the outer housing at a position corresponding to the USB connector.

The electronic device further includes an elastic apparatus disposed in a moving direction of the intermediate housing, and an intermediate housing movement positioning apparatus.

As for the electronic device with the USB connector provided in the present invention, initially, the USB connector on the intermediate housing is received in the outer housing, and the USB connector is in a received state. When the electronic device is in use, the intermediate housing is pushed to move relative to the outer housing, so that the USB connector is released from the USB connector through hole on the outer housing. At this time, the USB connector is in a released state, and the electronic device can be used. In the electronic device of the present invention, the USB connector on the intermediate housing, under the combined effect of the elastic apparatus and the intermediate housing movement positioning apparatus, may switch between the received state and released state, so that the present invention does not need to use the USB cap, thereby avoiding the problem in the conventional art that the USB cap may easily get lost.

DETAILED DESCRIPTION OF THE EMBODIMENTS

Figure 1:
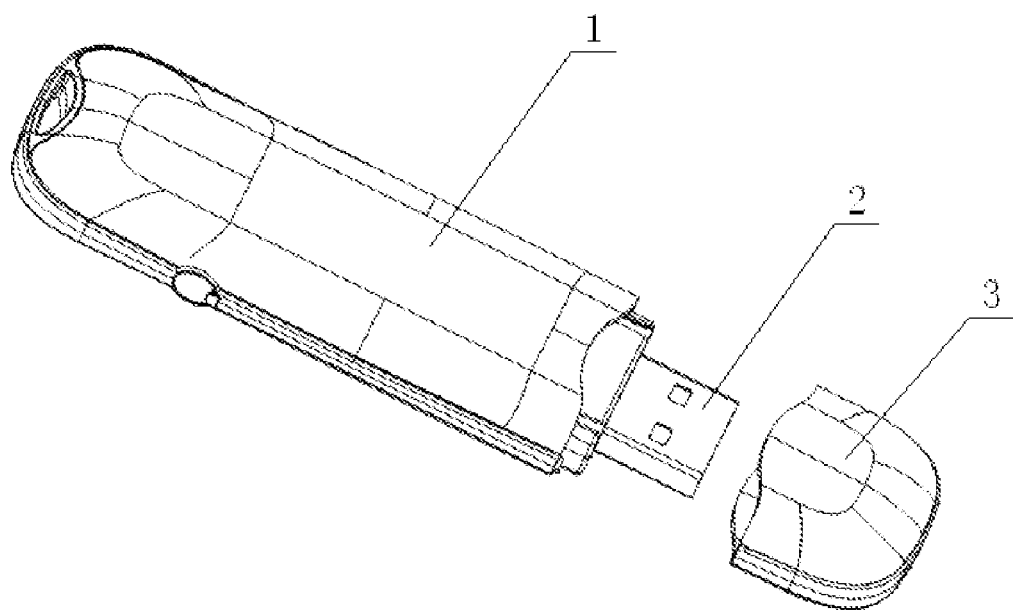
FIG. 1 is a schematic structural view of a USB Modem in the conventional art.
Figure 2:
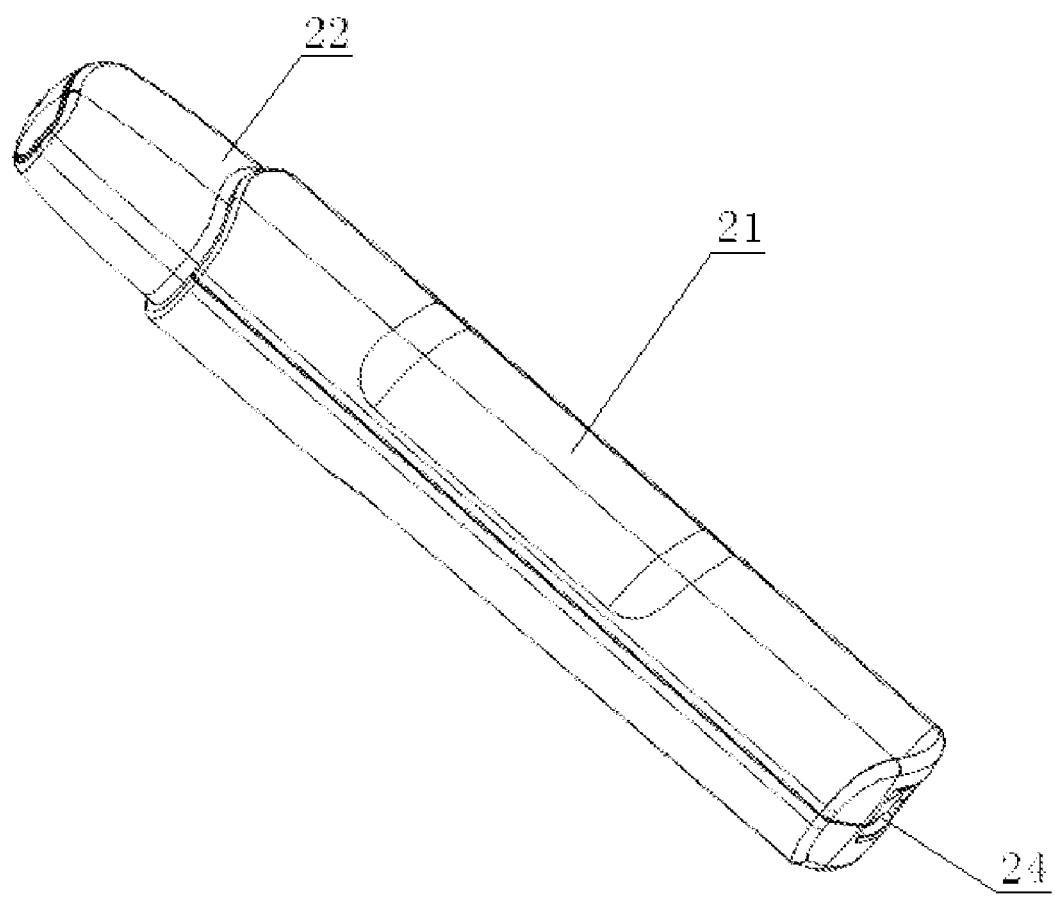
FIG. 2 is a schematic structural view of an appearance of an electronic device with a USB connector provided by an embodiment of the present invention when the USB connector is in a received state.

In order to solve the problem in the conventional art that the USB cap on the electronic device may easily get lost, the present invention is directed to an electronic device with a USB connector. Hereinafter an embodiment of the present invention is described in detail with reference to the accompanying drawings.

The embodiment of the present invention provides an electronic device with a USB connector, which, as shown in FIGS. 2 to 7, includes an outer housing 21, an intermediate housing 22 located inside the outer housing 21 and moveable relative to the outer housing 21, and a circuit board (not shown) inside the intermediate housing 22.

The USB connector 23 is disposed on the intermediate housing 22 and electrically connected to the circuit board.

A USB connector through hole 24 is configured on the outer housing 21 at a position corresponding to the USB connector 23.

The electronic device further includes an elastic apparatus 25 disposed in a moving direction of the intermediate housing 22, and an intermediate housing movement positioning apparatus 26.

In this embodiment, electronic components like chips are disposed on the circuit board for realizing the electrical functions of the whole electronic device. The USB connector 23 is connected to the circuit board, and the electronic device realizes data communication with devices such as computers through the USB connector 23.

As for the electronic device with the USB connector provided in the embodiment of the present invention, initially, the USB connector 23 on the intermediate housing 22 is received in the outer housing 21, and the USB connector 23 is in a received state. When the electronic device is in use, the intermediate housing 22 is pushed to move relative to the outer housing 21, so that the USB connector 23 is released from the USB connector through hole 24 on the outer housing 21. At this time, the USB connector 23 is in a released state, and the electronic device can be used. In the electronic device of the embodiment of the present invention, the USB connector 23 on the intermediate housing 22, under the combined effect of the elastic apparatus 25 and the intermediate housing movement positioning apparatus 26, may switch between the received state and released state, so that the embodiment of the present invention does not need to use the USB cap, thereby avoiding the problem in the conventional art that the USB cap may easily get lost.

In the electronic device of this embodiment, the USB connector 23 on the intermediate housing 22, under the combined effect of the elastic apparatus 25 and the intermediate housing movement positioning apparatus 26, may switch between the received state and released state. The functions of the two apparatus are illustrated in detail as follows.

Initially, an elastic force of the elastic apparatus 25 enables the USB connector 23 on the intermediate housing 22 to be received in the outer housing 21. When the electronic device is in use, the intermediate housing 22 is pushed to release the USB connector 23 out of the outer housing 21. During this process, the movement of the intermediate housing 22 causes a continuous deformation of the elastic apparatus 25, and after the intermediate housing 22 is pushed for a certain distance, the intermediate housing movement positioning apparatus 26 is triggered to generate a positioning effect. Under the positioning effect, the intermediate housing 22 and the outer housing 21 remain static, and the USB connector 23 on the intermediate housing 22 remains in the released state. When the electronic device is not in use, the intermediate housing movement positioning apparatus 26 is triggered again to disenable the positioning effect. Therefore, under the deformation force of the elastic apparatus 25, the electronic device recovers to the initial state, and the USB connector 23 returns to the received state.

In order to realize the aforementioned operating process, detailed illustrations on the elastic apparatus 25 and the intermediate housing movement positioning apparatus 26 in the embodiment of the present invention are given hereinafter.

Figure 3:
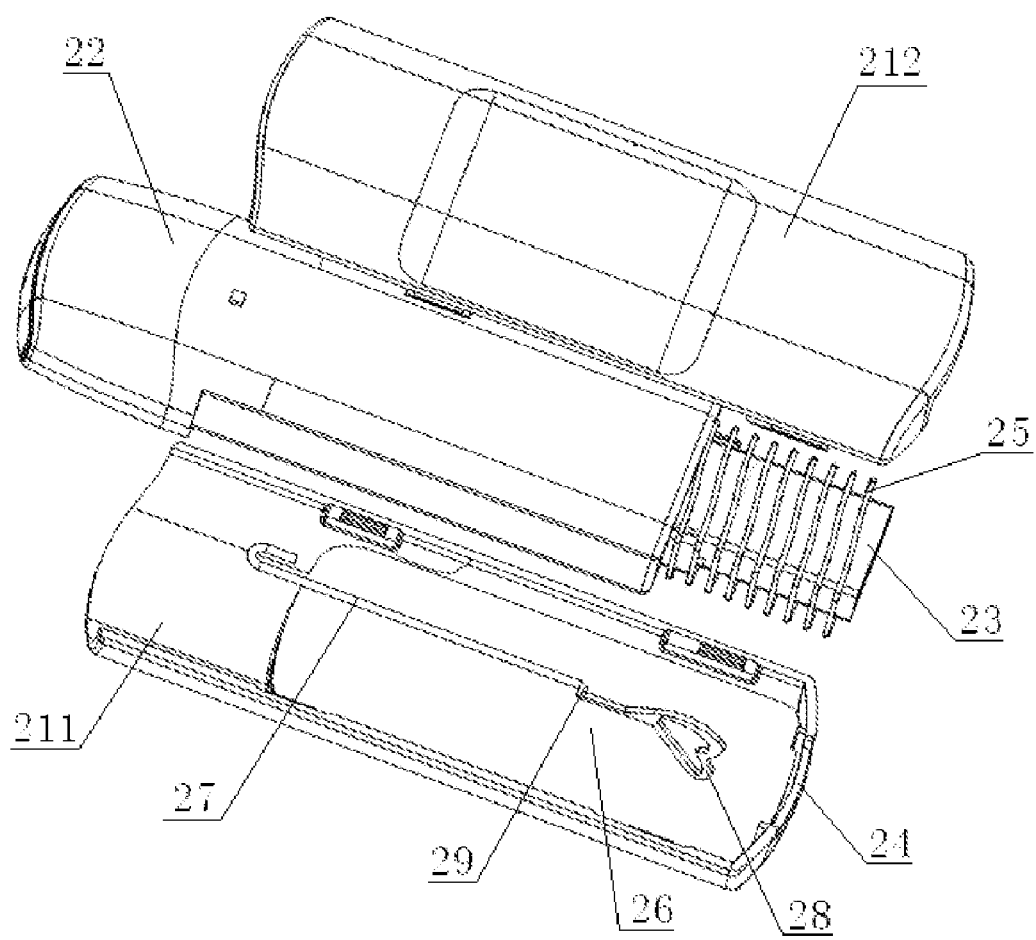
FIG. 3 is a schematic structural view of each separated part of the electronic device in FIG. 2 when the USB connector is in the received state.

The elastic apparatus 25 in this embodiment, as shown in FIG. 3, includes a spring located inside the outer housing and wound around the USB connector 23. The spring keeps exerting an elastic force on the intermediate housing 22 and the outer housing 21, so as to ensure a certain distance therebetween. In the setting manner shown in FIG. 3, the outer housing 21 and the intermediate housing 22 are directly utilized to support two ends of the spring. It is easy to realize the setting manner, and the spring is located in an idle space surrounding the USB connector 23, so that no additional space will be occupied.

In addition, the elastic apparatus 25 may also be disposed at a side of the intermediate housing 22, and the spring may also be replaced with other elastic components (such as a rubber band). As compared with the elastic apparatus of this embodiment, other implementation manners also have the same principle and similar structure, and thus are not repeated herein one by one.

The intermediate housing movement positioning apparatus 26 in this embodiment, as shown in FIGS. 3 to 7, includes a pendulum spring 27 and a pendulum spring chute 28.

One end of the pendulum spring 27 is fixed on an external surface of the intermediate housing 22, and the other end thereof has a folding arm 29 disposed thereon and located within the pendulum spring chute 28.

The pendulum spring chute 28 is located on an internal surface of the outer housing 21, and the pendulum spring chute 28 is heart-shaped. The heart-shaped pendulum spring chute 28 has a pendulum spring propelling chute 281 at one side, and a pendulum spring receding chute 282 at the other side.

In this embodiment, in order to show the internal structure of the electronic device, the outer housing 21 is divided into an upper housing 211 and a lower housing 212. Furthermore, in order to facilitate the processing of the outer housing 21, the outer housing 21 may also employ a structure of combined upper and lower housings. In this embodiment, the pendulum spring chute 28 is located on the internal surface of the upper housing 211.

Hereinafter the operating process of the intermediate housing movement positioning apparatus 26 in this embodiment is described in detail with reference to the structure thereof.

Initially, the USB connector 23 of the electronic device is in a received state. At this time, the folding arm 29 at the end of the pendulum spring 27 is located at a lower end point A of the pendulum spring chute 28.

When the electronic device is in use, the intermediate housing 22 is pushed upward to release the USB connector 23 out of the outer housing 21, and then the pushing is stopped. During this process, the intermediate housing 22 firstly drives the pendulum spring 27 to move upward, and the folding arm 29 moves from the lower end point A to a right upper end point B of the pendulum spring chute 28 along the pendulum spring propelling chute 281, and then the pushing is stopped. Under the effect of the elastic force of the elastic apparatus 25, the intermediate housing 22 further drives the pendulum spring 27 to move downward, and the folding arm 29 moves from the right upper end point B to a middle end point C along the pendulum spring chute 28. At the point C, since the folding arm 29 is blocked by the pendulum spring chute 28, the pendulum spring 27 cannot go on moving downward, and the intermediate housing 22 stops moving correspondingly. At this time, the USB connector 23 of the electronic device remains in the released state.

When the electronic device is not in use, the intermediate housing 22 is also pushed upward first, and then the pushing is stopped. During this process, the intermediate housing 22 firstly drives the pendulum spring 27 to move upward, and the folding arm 29 moves from the point C to a left upper end point D of the pendulum spring chute 28, and then the pushing is stopped. Under the effect of the elastic force of the elastic apparatus 25, the intermediate housing 22 further drives the pendulum spring 27 to move downward, the folding arm 29 moves from the point D back to the point A of the pendulum spring chute 28, and the USB connector 23 of the electronic device returns to the received state.

In this embodiment, the pendulum spring chute 28 is heart-shaped, and has a pendulum spring propelling chute 281 at its right side and a pendulum spring receding chute 282 at its left side. By means of an appropriate design of the angles of the pendulum spring propelling chute 281 and the pendulum spring receding chute 282 at the end points (four points A, B, C, and D), after being pushed, the folding arm 29 automatically enters the pendulum spring propelling chute 281 from the initial position of the point A, then enters the pendulum spring receding chute 282 from the pendulum spring propelling chute 281, and finally returns to the initial position of the point A from the pendulum spring receding chute 282.

Figure 4:
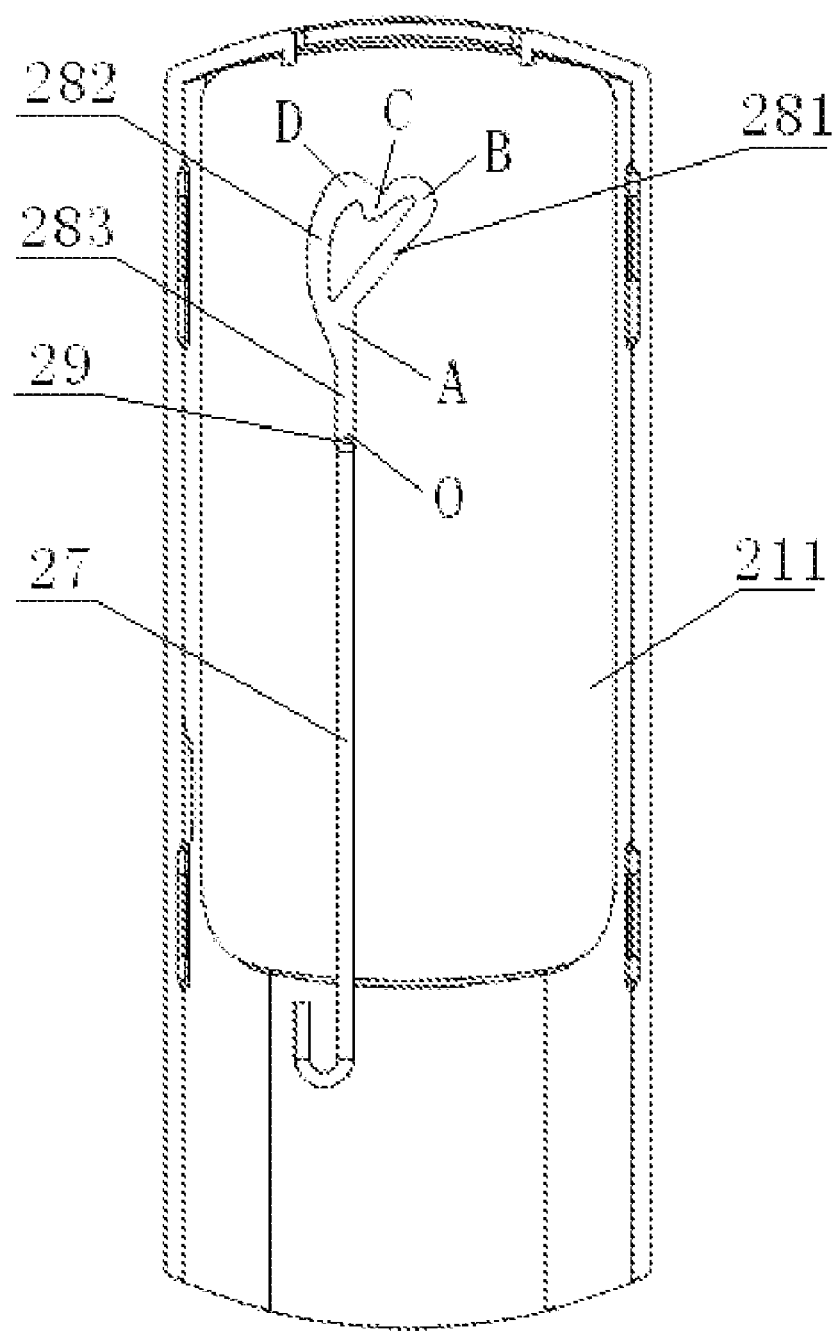
FIG. 4 is a schematic structural view of an upper housing and a pendulum spring in the electronic device shown in FIG. 3.

A preferred design of the heart-shaped pendulum spring chute 28 is shown in FIG. 4. The angle between the line from point A to point B, and the vertical line through point A, is larger than the angle between the line from point A to point D, and the vertical line through point A. The angle between the line from point C to point B, and the vertical line through point C, is larger than the angle between the line from point C to point D, and the vertical line through point C. It is preferred that point A and point C is not in the same vertical line.

In another embodiment, the pendulum spring chute 28 is half-heart-shaped, for example, only the pendulum spring propelling chute 281 or the pendulum spring receding chute 282 exists. In another embodiment, the pendulum spring chute 28 is full-heart-shaped, the pendulum spring propelling chute 281 and the pendulum spring receding chute 282 is symmetrical.

During the operating process of the aforementioned intermediate housing movement positioning apparatus 26, it is convenient for the user to realize the releasing and receiving of the USB connector 23 of the electronic device only through simple pushing motions.

In order to reduce the occupied space within the electronic device, a pendulum slot 30 is configured on the intermediate housing 22, and the pendulum spring 27 is located within the pendulum slot 30. In this manner, when the folding arm 29 at the end of the pendulum spring 27 moves back and forth in the pendulum spring chute 28, the body of the pendulum spring 27 swings left to right in the pendulum slot 30, so that the space occupied by the body of the pendulum spring 27 is saved.

Furthermore, in this embodiment, the process of fixing one end of the pendulum spring 27 on the intermediate housing 22 may be realized through the following manner.

Figure 5:
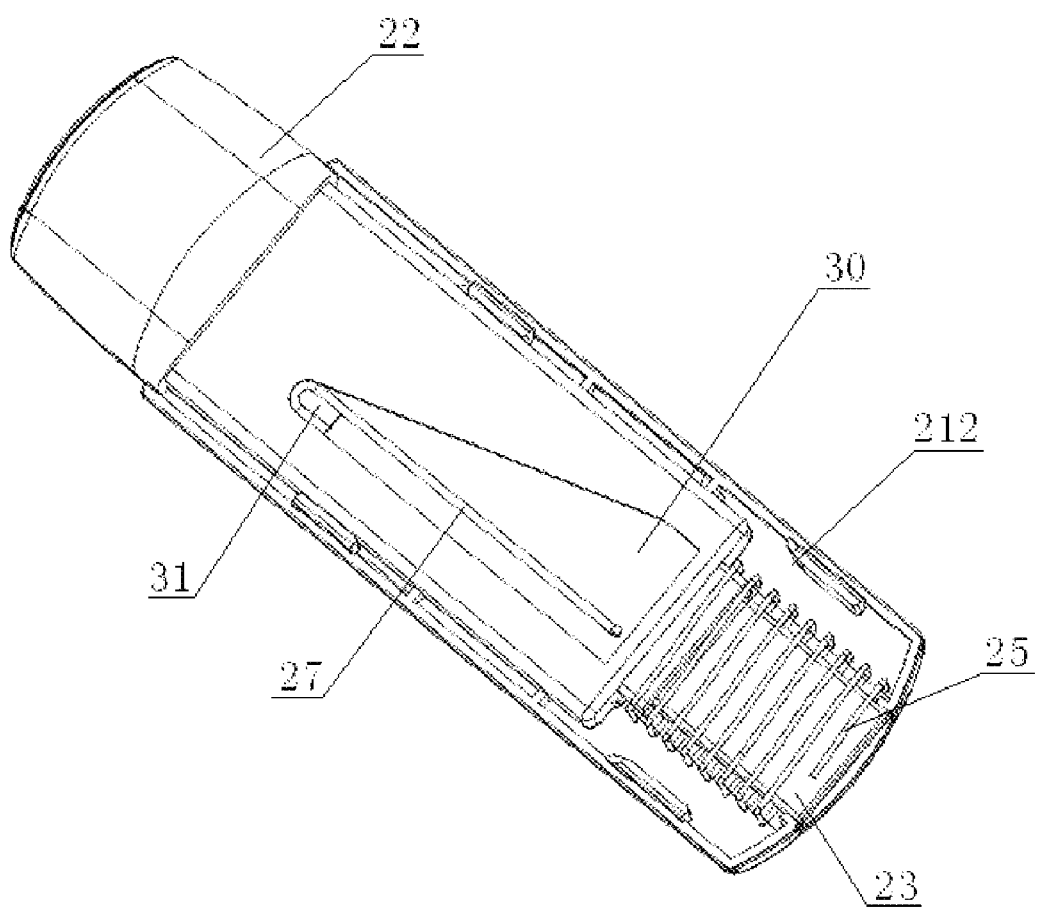
FIG. 5 is a schematic structural view of a lower housing, an intermediate housing, and the pendulum spring in the electronic device shown in FIG. 3.
Figure 6:
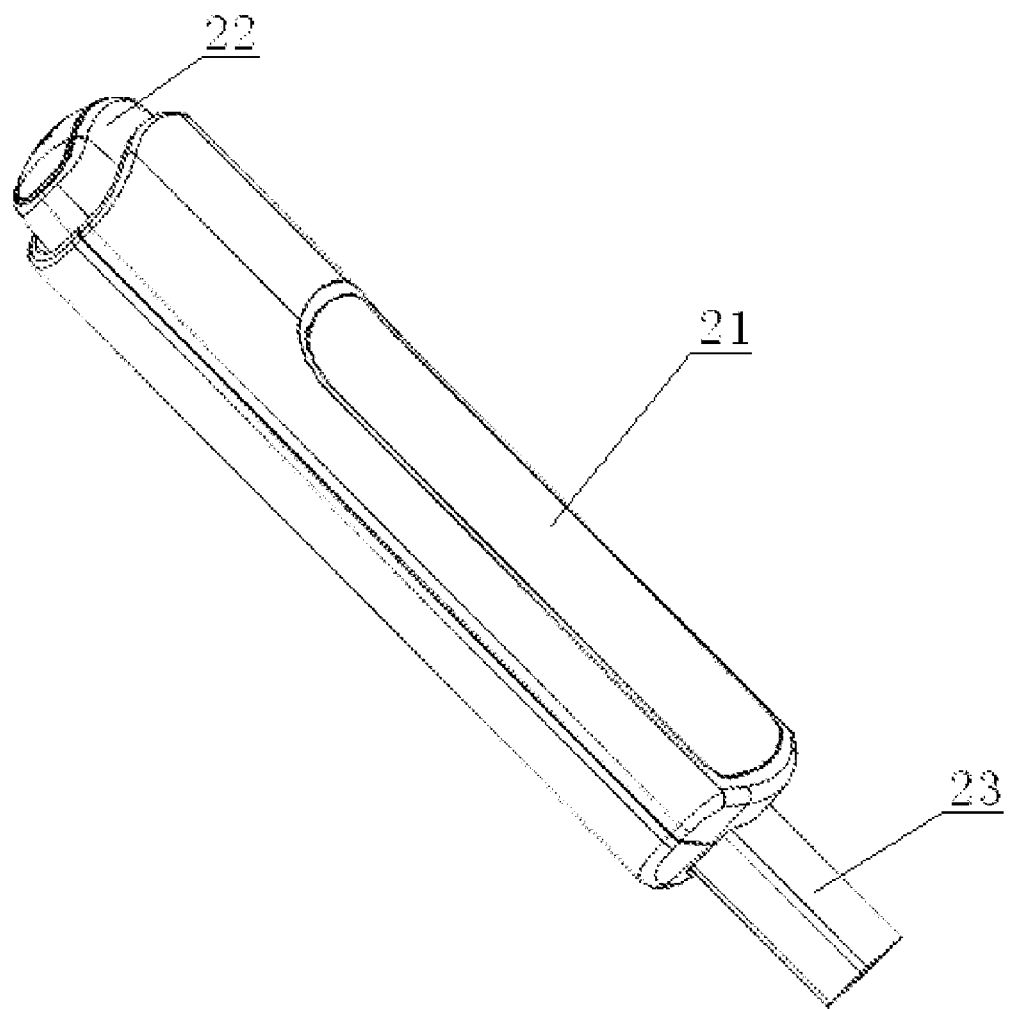
FIG. 6 is a schematic structural view of the appearance of the electronic device in FIG. 2 when the USB connector is in a released state.
Figure 7:
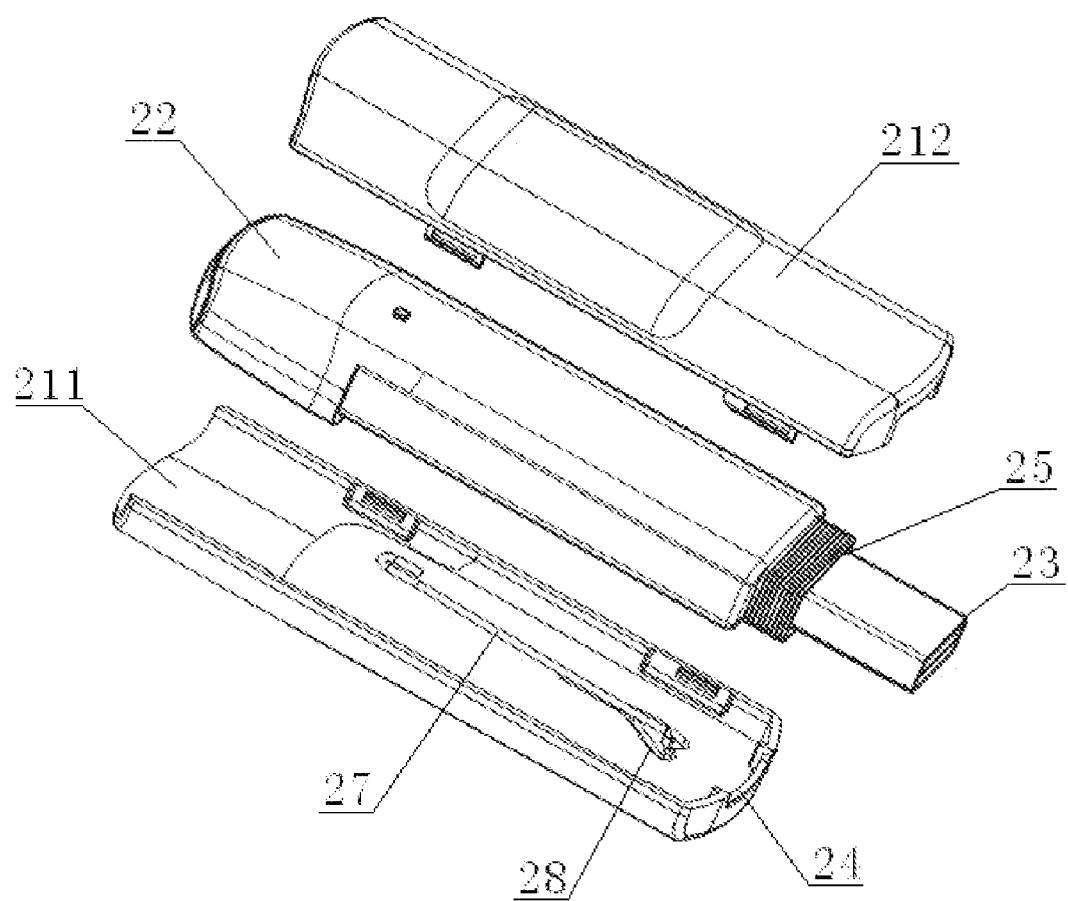
FIG. 7 is a schematic structural view of each separated part of the electronic device in FIG. 6 when the USB connector is in the released state.

As shown in FIG. 5, a pillar 31 is configured at a lower end of the pendulum slot 30, and the end of the pendulum spring 27 is closely clipped between the pillar 31 and the pendulum slot 30. The pendulum spring 27 may also be fixed by screws or by other commonly used fixing methods, and the details thereof are not described herein again.

As for the intermediate housing movement positioning apparatus 26 in this embodiment, the pendulum spring 27 thereof is disposed on the intermediate housing 22, and the pendulum spring chute 28 is disposed on the outer housing 21. During the specific implementation, the positions of the pendulum spring 27 and the pendulum spring chute 28 can be exchanged, and other technical features remain the same. That is, the following technical solution is adopted.

The intermediate housing movement positioning apparatus includes a pendulum spring and a pendulum spring chute.

One end of the pendulum spring is fixed on an internal surface of the outer housing, and the other end thereof has a folding arm disposed thereon and located within the pendulum spring chute.

The pendulum spring chute is located on an external surface of the intermediate housing, and the pendulum spring chute is heart-shaped. The heart-shaped pendulum spring chute has a pendulum spring propelling chute at one side, and a pendulum spring receding chute at the other side.

When the intermediate housing movement positioning apparatus adopts the technical solution in which the positions of the pendulum spring 27 and the pendulum spring chute 28 are exchanged, the position of the pendulum slot also needs to be changed correspondingly, that is, the pendulum slot is configured on the outer housing, and the pendulum spring is located within the pendulum slot.

In addition, the intermediate housing movement positioning apparatus also has other implementing manners. For example, a plurality of jacks is configured on the intermediate housing, and a pin is disposed on the outer housing. When the electronic device is in use, the intermediate housing is pushed to move to a certain position relative to the outer housing, and then the pin is pressed, so that the positions of the intermediate housing and the outer housing are fixed. When the electronic device is not in use, the pin is loosened, and the intermediate housing automatically recovers to the initial position under the effect of the elastic apparatus. In this manner, the user is required not only to push the intermediate housing, but also to press the pin, so that the operating process is a little bit complicated.

In the specific implementation, the intermediate housing movement positioning apparatus is not limited to the aforementioned three embodiments, but other circumstances may not be described herein one by one.

In the embodiment of the present invention, in order to enable the intermediate housing to move steadily, as shown in FIG. 3, the pendulum spring chute 28 may also include a common chute 283, which is located at a lower part of the pendulum spring chute 28, and communicated with the pendulum spring propelling chute 281 and the pendulum spring receding chute 282. In this manner, initially, the folding arm 29 is located at a lower end point O of the common chute 283. When the electronic device is in use, a moving route of the folding arm 29 at the end of the pendulum spring 27 is OABC; and when the electronic device is not in use, a moving route of the folding arm 29 is CDAO. The detailed operating process is the same as the above, and thus is not repeated herein again. In this embodiment, the common chute 283 may elongate the chute and reduce the gradient, so that the intermediate housing 22 moves more steadily.

The embodiment of the present invention is applicable to electronic devices with a USB connector such as a wireless USB Modem or a USB flash drive.

Although the present invention is described above with some preferred embodiments, the scope thereof is not limited thereby. Various modifications and variations that can be easily thought of by persons skilled in the art without departing from the scope or spirit of the invention shall be considered falling within the scope of the invention. Therefore, the protection scope of the invention falls in the appended claims.

What is claimed is:

1. An electronic device comprising:
   an outer housing;
   an intermediate housing located inside the outer housing and moveable relative to the outer housing;
   a circuit board located inside the intermediate housing;
   an elastic apparatus disposed in a moving direction of the intermediate housing;
   an intermediate housing movement positioning apparatus;
   a USB connector disposed on the intermediate housing, and electrically connected to the circuit board,
   wherein a USB connector through hole is configured on the outer housing at a position corresponding to the USB connector;
   wherein the intermediate housing movement positioning apparatus comprises a pendulum spring and a pendulum spring chute, and
      wherein one end of the pendulum spring is fixed on an external surface of the intermediate housing, and the other end thereof has a folding arm disposed thereon and located within the pendulum spring chute; and
      the pendulum spring chute is located on an internal surface of the outer housing, and the pendulum spring chute is heart-shaped, and the heart-shaped pendulum spring chute has a pendulum spring propelling chute at one side and a pendulum spring receding chute at the other side.

2. The electronic device according to claim 1, wherein the elastic apparatus comprises a spring located inside the outer housing and wound around the USB connector.

3. An electronic device comprising:
an outer housing;
an intermediate housing located inside the outer housing and moveable relative to the outer housing;
a circuit board located inside the intermediate housing;
an elastic apparatus disposed in a moving direction of the intermediate housing;
an intermediate housing movement positioning apparatus;
a USB connector disposed on the intermediate housing, and electrically connected to the circuit board,
wherein a USB connector through hole is configured on the outer housing at a position corresponding to the USB connector,
wherein the intermediate housing movement positioning apparatus comprises a pendulum spring and a pendulum spring chute, wherein
one end of the pendulum spring is fixed on an internal surface of the outer housing, and the other end thereof has a folding arm disposed thereon and located within the pendulum spring chute; and
the pendulum spring chute is located on an external surface of the intermediate housing, and the pendulum spring chute is half-heart-shaped.

4. The electronic device according to claim 1, wherein a pendulum slot is configured on the intermediate housing, and the pendulum spring is located within the pendulum slot.

5. An electronic device comprising:
an outer housing;
an intermediate housing located inside the outer housing and moveable relative to the outer housing;
a circuit board located inside the intermediate housing;
an elastic apparatus disposed in a moving direction of the intermediate housing;
an intermediate housing movement positioning apparatus;
a USB connector disposed on the intermediate housing, and electrically connected to the circuit board,
wherein a USB connector through hole is configured on the outer housing at a position corresponding to the USB connector,
wherein the intermediate housing movement positioning apparatus comprises a pendulum spring and a pendulum spring chute,
wherein one end of the pendulum spring is fixed on an internal surface of the outer housing, and the other end thereof has a folding arm disposed thereon and located within the pendulum spring chute; and
the pendulum spring chute is located on an external surface of the intermediate housing, and the pendulum spring chute is heart-shaped, and the heart-shaped pendulum spring chute has a pendulum spring propelling chute at one side and a pendulum spring receding chute at the other side.

6. The electronic device according to claim 5, wherein a pendulum slot is configured on the outer housing, and the pendulum spring is located within the pendulum slot.

7. The electronic device according to claim 1, wherein the pendulum spring chute further comprises a common chute located at a lower part of the pendulum spring chute, and communicated with the pendulum spring propelling chute and the pendulum spring receding chute.

8. The electronic device according to claim 4, wherein the pendulum spring chute further comprises a common chute located at a lower part of the pendulum spring chute, and communicated with the pendulum spring propelling chute and the pendulum spring receding chute.

9. The electronic device according to claim 5, wherein the pendulum spring chute further comprises a common chute located at a lower part of the pendulum spring chute, and communicated with the pendulum spring propelling chute and the pendulum spring receding chute.

10. The electronic device according to claim 6, wherein the pendulum spring chute further comprises a common chute located at a lower part of the pendulum spring chute, and communicated with the pendulum spring propelling chute and the pendulum spring receding chute.

11. An electronic device comprising:
an outer housing;
an intermediate housing located inside the outer housing and moveable relative to the outer housing;
a circuit board located inside the intermediate housing;
an elastic apparatus disposed in a moving direction of the intermediate housing;
an intermediate housing movement positioning apparatus;
a USB connector disposed on the intermediate housing, and electrically connected to the circuit board,
wherein a USB connector through hole is configured on the outer housing at a position corresponding to the USB connector,
wherein the intermediate housing movement positioning apparatus comprises a pendulum spring and a pendulum spring chute, and wherein
one end of the pendulum spring is fixed on an external surface of the intermediate housing, and the other end thereof has a folding arm disposed thereon and located within the pendulum spring chute; and
the pendulum spring chute is located on an internal surface of the outer housing, and the pendulum spring chute is half-heart-shaped.

\* \* \* \* \*